United States Patent
Furuyama et al.

(10) Patent No.: US 8,952,271 B2
(45) Date of Patent: Feb. 10, 2015

(54) CIRCUIT BOARD, SEMICONDUCTOR DEVICE, AND METHOD OF MANUFACTURING SEMICONDUCTOR DEVICE

(71) Applicant: Fujitsu Limited, Kawasaki-shi, Kanagawa (JP)

(72) Inventors: Masaharu Furuyama, Kawasaki (JP); Daisuke Mizutani, Kawasaki (JP); Seiki Sakuyama, Kawasaki (JP); Toshiya Akamatsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/106,041

(22) Filed: Dec. 13, 2013

(65) Prior Publication Data

US 2014/0103097 A1    Apr. 17, 2014

Related U.S. Application Data

(62) Division of application No. 12/243,500, filed on Oct. 1, 2008, now abandoned.

(30) Foreign Application Priority Data

Oct. 5, 2007 (JP) ................................. 2007-262334

(51) Int. Cl.
*H05K 1/11* (2006.01)
*H05K 1/14* (2006.01)
(Continued)

(52) U.S. Cl.
CPC ............ *H05K 3/10* (2013.01); *H01L 23/49811* (2013.01); *H05K 3/244* (2013.01);
(Continued)

(58) Field of Classification Search
USPC .......................... 361/736–812; 174/250–268
See application file for complete search history.

(56) References Cited

U.S. PATENT DOCUMENTS

| 6,781,234 B2 | 8/2004 | Hayashida |
| 6,787,442 B2 | 9/2004 | Hayashida |

(Continued)

FOREIGN PATENT DOCUMENTS

| JP | 61-198507 A | 9/1986 |
| JP | 04-329891 A | 11/1992 |

(Continued)

OTHER PUBLICATIONS

Japanese Office Action dated Aug. 11, 2009, issued in corresponding Japanese Patent Application No. 2007-262334 (with English Translation).

(Continued)

*Primary Examiner* — Jerry Wu
(74) *Attorney, Agent, or Firm* — Westerman, Hattori, Daniels & Adrian, LLP (57) ABSTRACT

There is provided a circuit board to which a solder ball composed of a lead (Pb)-free solder is to be connected, a semiconductor device including an electrode and a solder ball composed of a lead (Pb)-free solder disposed on the electrode, and a method of manufacturing the semiconductor device, in which mounting reliability can be improved by enhancing the bonding strength (adhesion strength) between the solder ball composed of a lead (Pb)-free solder and the electrode.

6 Claims, 10 Drawing Sheets

(51) Int. Cl.
- *H05K 7/00* (2006.01)
- *H05K 5/00* (2006.01)
- *H05K 7/04* (2006.01)
- *H05K 3/10* (2006.01)
- *H01L 23/498* (2006.01)
- *H05K 3/24* (2006.01)
- *H05K 3/34* (2006.01)

(52) U.S. Cl.
CPC ..... *H01L2924/15311* (2013.01); *H05K 3/3436* (2013.01); *H05K 3/3463* (2013.01); *H05K 2203/1105* (2013.01); *H01L 2924/0002* (2013.01)
USPC ........... 174/267; 174/263; 174/265; 174/268; 361/736; 361/743; 361/746; 361/767; 361/777; 361/811; 361/812; 361/808

(56) References Cited

U.S. PATENT DOCUMENTS

| | | | |
|---|---|---|---|
| 2004/0026769 A1 | 2/2004 | Nakamura | |
| 2007/0040282 A1* | 2/2007 | Jung et al. | 257/780 |
| 2008/0264681 A1 | 10/2008 | Iwai et al. | |
| 2010/0243300 A1* | 9/2010 | Amin et al. | 174/257 |

FOREIGN PATENT DOCUMENTS

| | | |
|---|---|---|
| JP | 2003-37133 A | 2/2003 |
| JP | 2006-179798 A | 7/2006 |
| TW | 1229580 B | 3/2005 |
| TW | 200612797 A | 4/2006 |
| WO | 0176335 A1 | 10/2001 |

OTHER PUBLICATIONS

Taiwan Office Action dated Dec. 29, 2011, issued in corresponding Taiwan Patent Application No. 97135454.

Explanation by foregin associate dated Feb. 8, 2012, for Taiwanese Office Action Dec. 29, 2011, and Taiwanese publication document TW1229580.

Korean Office Action dated Jul. 26, 2010, issued in Korean Patent Application No. 10-2008-0095217.

\* cited by examiner

CIRCUIT BOARD, SEMICONDUCTOR DEVICE, AND METHOD OF MANUFACTURING SEMICONDUCTOR DEVICE

This patent application is a divisional of Ser. No. 12/243,500 filed Oct. 1, 2008, which is based upon and claims the benefit of priority of the prior Japanese Patent Application No. 2007-262334 filed on Oct. 5, 2007, the entire contents of which are incorporated herein by reference.

BACKGROUND OF THE INVENTION

1. Field of the Invention

The present invention relates to a circuit board, a semiconductor device, and a method of manufacturing a semiconductor device. More particularly, the invention relates to a circuit board having an electrode to which a solder ball composed of a lead-free solder (a Pd-free solder) is to be connected, a semiconductor device including an electrode and a solder ball which is composed of a lead-free solder and disposed on the electrode, and a method of manufacturing the semiconductor device.

2. Description of the Related Art

With the reduction in size, increase in density, and increase in functionality of electronic equipment in recent years, there have been demands for reduction in size and thickness of electronic components. Under these circumstances, ball grid array (BGA) surface-mount semiconductor device packages have been proposed, in which the mounting area is decreased by the reduction in size, allowing high-density mounting, and which can cope with an increase in the number of input-output pins due to the increase in functionality.

In a BGA semiconductor device, a plurality of spherical, projecting electrodes for external connection, which are also referred to as "solder bumps", are arranged in a grid pattern on a lower surface of a support board (package board), on an upper surface of which semiconductor elements are placed and fixed. The support board is mounted on a wiring circuit board (motherboard) through the solder bumps, and the electrodes of the support board are connected to wiring portions of the wiring circuit board through the solder bumps.

Examples of a known method of connecting a circuit board of a BGA semiconductor device to a wiring circuit board through solder bumps will be described below with reference to FIGS. 1A, 1B, 1C, and 2. In an example shown in these figures each are an enlarged view of a connecting portion between a circuit board and a wiring circuit board through a solder bump, and semiconductor elements, etc. mounted on an upper surface of the circuit board are not shown.

Figure 1A:
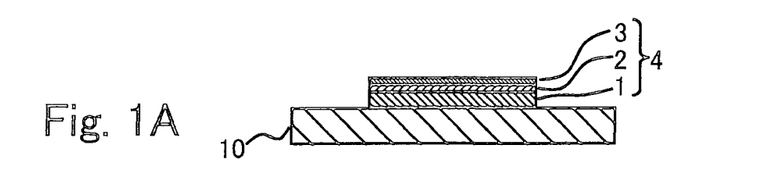
FIGS. 1A to 1C are cross-sectional views showing a known method of connecting a support board to a wiring circuit board through a solder bump.

For performing the method, first, as shown in FIG. 1A, a support board (package board) 10 is prepared, where the support board includes a base composed of an insulating resin, such as a glass epoxy resin, and a plurality of wiring substrates disposed on the base, each wiring substrate having a conductive layer composed of copper (Cu) or the like selectively arranged on the surface thereof. An electrode portion 4 is formed on a principal surface of the support board 10, opposite to a principal surface on which semiconductor elements (not shown) are mounted. The electrode portion 4 includes a copper (Cu) layer 1 containing copper (Cu) as a main component formed with photolithography, or the like, on the base, a nickel (Ni) layer 2 containing nickel (Ni) as a main component, and a gold (Au) layer 3 containing gold (Au) as a main component disposing by plating in that order on the copper (Cu) layer 1. The nickel (Ni) layer 2 and the gold (Au) layer 3 stacked on the copper (Cu) layer 1 can prevent oxidation of the copper contained in the copper (Cu) layer 1.

Figure 1B:
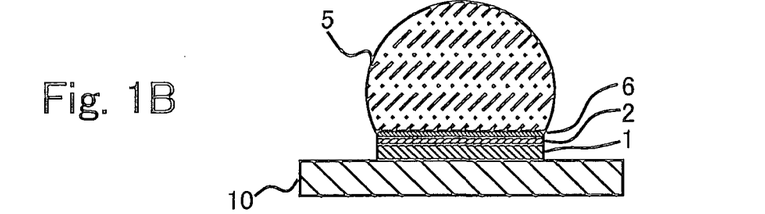

Then, as shown in FIG. 1B, a solder bump 5, which is a spherical, projecting electrode for external connection, is disposed on the electrode portion 4, the solder bump 5 being composed of a eutectic solder containing tin and lead at a ratio of about 6:4. Then, by performing a heat treatment at a temperature that is equal to or higher than the melting point of the solder bump 5, e.g., 200° C. until the support board 10 is bonded to a wiring circuit board (motherboard) 25, which is described later, via the solder bumps 5.

As described above, since the gold (Au) layer 3 containing gold (Au) as a main component is formed on the top of the electrode portion 4 as shown in FIG. 1A, the solder bump 5 is allowed to spread on the surface of the electrode portion 4, namely on the top layer of the electrode portion 4.

Since disposing the solder bump 5 on the electrode 4 results in diffusion of the gold composing of the gold (Au) layer 1 into the solder bump 5, the surface of the nickel (Ni) layer 2 containing nickel (Ni) as a main component is wetted by the solder bump 5. As a result, a barrier layer 6 composed of tin (Sn) and nickel (Ni) is formed at the junction interface between the nickel (Ni) layer 2 and the solder bump 5.

Figure 1C:
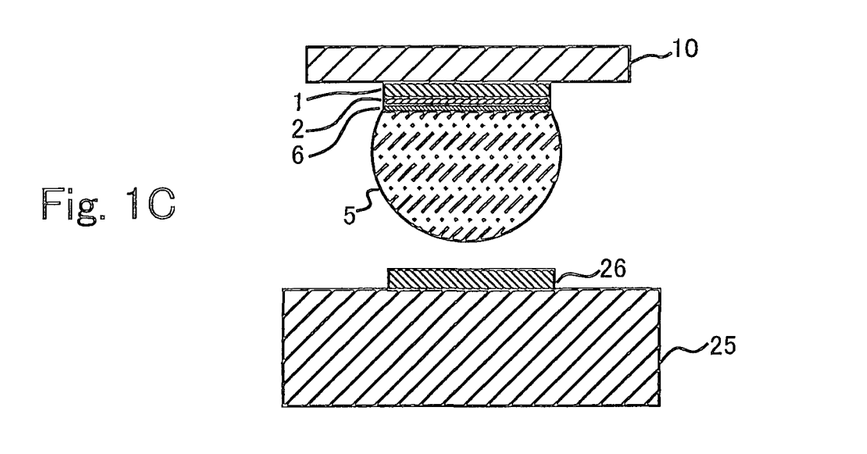

Next, as shown in FIG. 1C, the solder bump 5 connected to the support board 10 and the electrode 26 is aligned each other, where the electrode 26 is formed of cupper (Cu) on the principal surface of the wiring circuit board 25 composed of a base, such as an insulating resin, on which electro-conductive layers made of copper (Cu) or the like are selectively disposed. Then the solder bump disposed on the support board 10 is bonded to the electrode 26 on disposed on the wiring circuit board 25.

Figure 2:
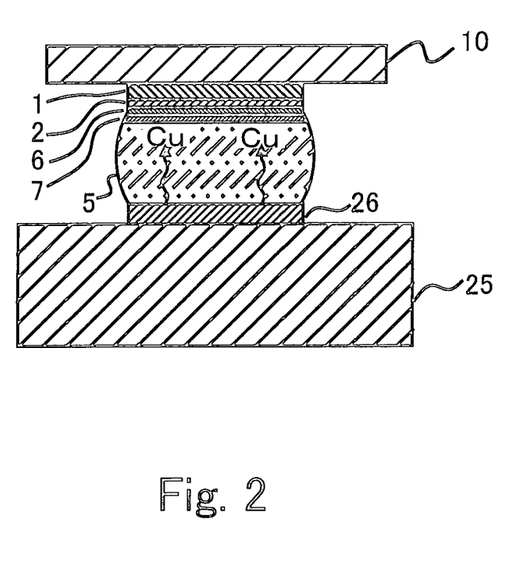
FIG. 2 is a cross-sectional view showing another known method of connecting a support board to a wiring circuit board through a solder bump.

When the support board 10 and the wiring circuit board 25 are bonded to each other through the solder bump 5, as indicated by arrows in FIG. 2, the copper constituting the electrode 26 diffuses into the solder bump 5, and a ternary compound layer 7 composed of tin (Sn)-copper (Cu)-nickel (Ni) is formed at the junction interface between the barrier layer 6 composed of tin (Sn)-nickel (Ni) and the solder bump 5, the ternary compound layer 7 being brittler than the barrier layer 6. That is, on the principal surface of the support board 10, the nickel (Ni) layer 2 containing nickel as a main component, the barrier layer composed of tin (Sn)-nickel (Ni), and the ternary compound layer 7 composed of tin (Sn)-copper (Cu)-nickel (Ni) is formed on the copper (Cu) layer 1 containing copper as a main component, and thereby the layers 1, 2, 6, and 7 form a multilayer structure of that order. Since the solder bump 5 is bonded to the copper (Cu) layer 1 and the nickel (Ni) layer 2 through the barrier layer 6 composed of tin (Sn)-nickel (Ni), sufficient bonding strength can be ensured.

In recent years, in view of environmental protection, it has been required to use a lead (Pb)-free solder, which is free from a lead (Pb) component, for solder bumps.

FIGS. 3A, 3B, 3C, and 4 show an example of a known method of connecting a circuit board of a BGA semiconductor device to a wiring circuit board through solder bumps composed of a lead (Pb)-free solder. These figures show magnified portions of a circuit board and a wiring circuit board which are connected through a solder bump using a lead-free (Pb free) solder. A semiconductors or the like mounded on the circuit board are not shown in these figures. The same components as those in FIG. 1A to 2 are represented by the same reference numerals, and a description thereof will be omitted.

Figure 3A:
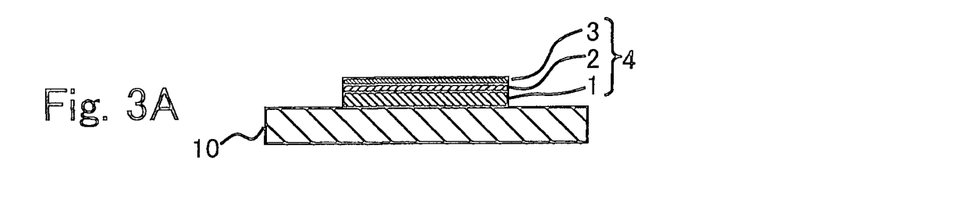
FIGS. 3A to 3C are cross-sectional views showing a known method of connecting a support board to a wiring circuit board through a solder bump.

In the method shown in FIG. 3A, first, a support board (a package board) 10 is prepared. Then, a copper (Cu) layer 1 containing copper (Cu) as a main component, a nickel (Ni) layer 2 containing nickel (Ni) as a main component, and a gold (Au) layer 3 containing gold (Au) as a main component are disposed in that order on a principal surface of a support board 10, opposite to a principal surface on which semiconductor elements (not shown) are mounted. The copper (Cu) layer 1 is formed by using the photolithography, and the nickel (Ni) layer 2 and the gold (Au) layer 3 are formed by using the electroless plating. The copper layer 1, the nickel layer 2, and the gold layer 3 constitute an electrode portion 4. The nickel (Ni) layer 2 and the gold (Au) layer 3 are formed on the copper (Cu) layer 1 can prevent oxidation of the copper contained in the copper (Cu) layer 1.

Figure 3B:
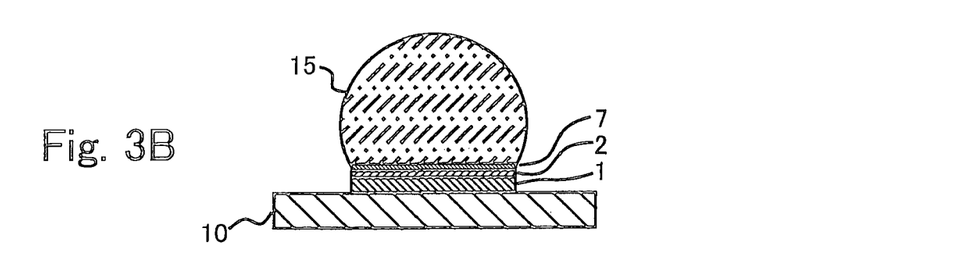

As shown in FIG. 3B, a solder bump 15, which is a spherical, projecting electrode for external connection, is disposed on the electrode portion 4, the solder bump 15 being composed of a lead (Pb)-free solder containing tin (Sn)-gold (Ag)-copper (Cu). Then, by performing a heat treatment at a temperature that is equal to or higher than the melting point of the solder bump 15, e.g., 230° C. or higher until the support board 10 is bonded to a wiring circuit board (motherboard) 25, which is described later, via the solder bumps 15.

As described above, since the gold (Au) layer 3 containing gold (Au) as a main component is formed on the top of the electrode portion 4 as shown in FIG. 3A, the solder bump 15 is allowed to spread on the surface of the electrode portion 4, namely on the top layer of the electrode portion 4.

When the solder bump 15 is disposed on the electrode portion 4, the gold (Au) constituting the gold (Au) layer 3 diffuses into the solder bump 15, and the solder bump 15 wets the surface of the nickel (Ni) layer 2 containing nickel (Ni) as a main component. As a result, a ternary compound layer 7 composed of tin (Sn)-nickel (Ni)-copper (Cu) is formed at the junction interface between the nickel (Ni) layer 2 and the solder bump 15.

Figure 3C:
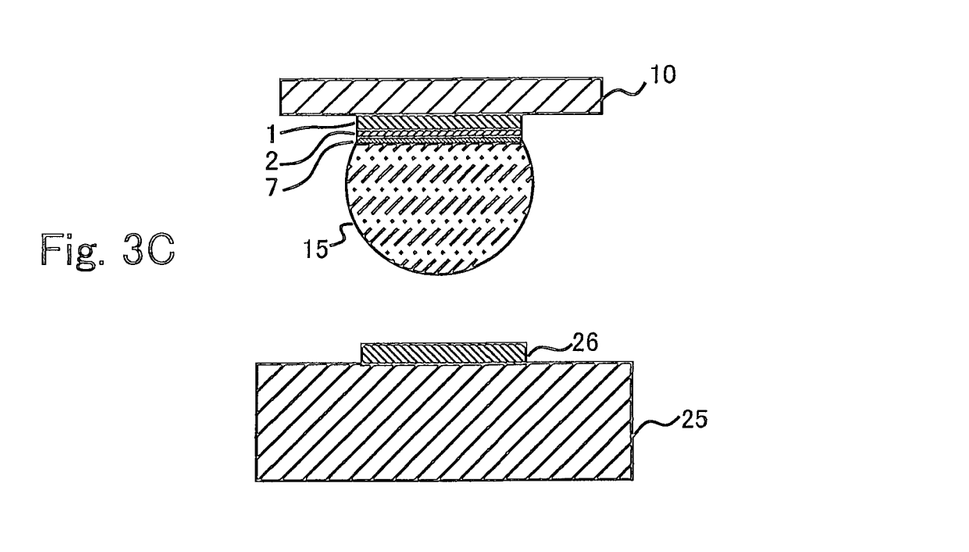

Referring to FIG. 3C, the solder bump 15 bonded to the support board 10 is aligned with an electrode 26 composed of copper (Cu) disposed on a principal surface of a wiring circuit board (motherboard) 25. Then, by performing a heat treatment at a temperature that is equal to or higher than the melting point of the solder bump 15, e.g., 230° C. or higher, the solder bump 15 bonded to the support board 10 is bonded to the electrode 26 composed of copper (Cu) disposed on the principal surface of the wiring circuit board 25.

Figure 4:
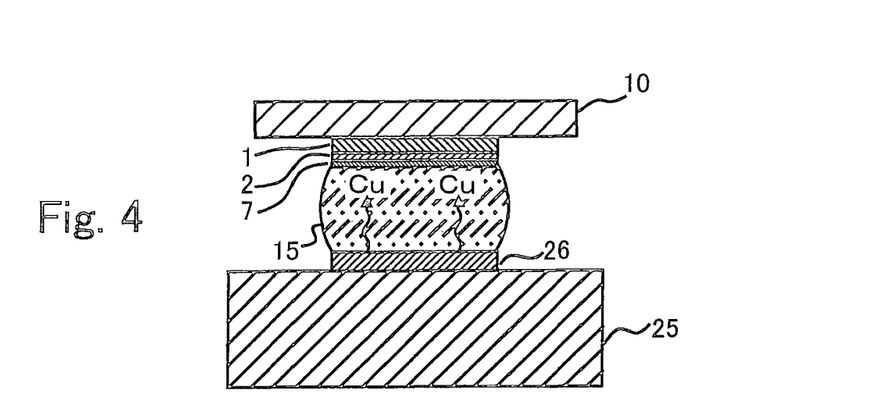
FIG. 4 is a cross-sectional view showing another known method of connecting a support board to a wiring circuit board through a solder bump.

Thereby, as indicated by arrows in FIG. 4, the copper (Cu) constituting the electrode 26 of the wiring circuit board 25 diffuses into the solder bump 15, and the ternary compound layer 7 composed of tin (Sn)-copper (Cu)-nickel (Ni) which is brittler than the barrier layer 6 shown in FIGS. 1B, 1C, and 2 is allowed to grow. That is, on the principal surface the support board 10, the nickel (Ni) layer 2 containing nickel as a main component is formed on the copper (Cu) layer 1 containing copper as a main component. A multilayer structure in which the ternary compound layer 7 composed of tin (Sn)-copper (Cu)-nickel (Ni) is disposed on the nickel (Ni) layer 2 is formed.

Furthermore, International Publication No. 01/076335 pamphlet proposes an embodiment in which an electronic component is mounted on a pad of a substrate through a connection layer containing a solder, and a diffusion prevention layer is disposed in the connection layer, the diffusion prevention layer preventing copper (Cu) in a base layer of the pad from diffusing into the solder of the connection layer.

Japanese Laid-open Patent Publication No. 2006-179798 proposes an embodiment in which a composite layer including a nickel (Ni) layer and a palladium (Pd) layer is disposed on a pad of a substrate, a solder is provided on the composite layer, and by performing a reflow treatment, a structure including a nickel (Ni) layer, a nickel (Ni)-tin (Sn) alloy layer, and a solder bump is formed.

However, in the case of the example using the lead-free (Pb free) solder bump 15 composed of the lead-free solder shown in FIGS. 3a to 4, the ternary compound layer 7 composed of tin (Sn)-copper (Cu)-nickel (Ni) is formed at a junction interface between the nickel (Ni) layer 2 and the solder bump 15. The ternary compound layer 7 is brittler than the barrier layer 6 composed of tin (Sn)-nickel (Ni) formed at the junction interface between the nickel (Ni) layer 2 and the solder bump 15 in the known example using the solder bump 5 composed of the lead (Pb) shown in FIGS. 1A to 2.

Consequently, the bonding strength between the solder bump 15 and the nickel (Ni) layer 2 provided with the ternary compound layer 7 composed of tin (Sn)-copper (Cu)-nickel (Ni) on the surface thereof in the embodiment shown in FIGS. 3A to 4 is lower than the bonding strength between the solder bump 5 and the nickel (Ni) layer 2 provided with the barrier layer 6 composed of tin (Sn)-nickel (Ni) on the surface thereof in the embodiment shown in FIGS. 1A to 2.

As described above, the heat treatment is performed at a temperature higher than the melting point of the solder bump 15 disposed on the electrode 4, such as 230° C. or higher, until the support board 10 and the wiring circuit board 25 are bonded each other. Thus there is a possibility that dimensional changes may occur in different planar directions between the support board 10 and the wiring circuit board 25 according to a temperature difference between the temperature higher than the melting point and the room temperature after the heat treatment.

In such a case, the stress generated at the junction interface between the nickel (Ni) layer 2 and the solder bump 15 increases, and the adhesion strength between the nickel (Ni) layer 2 and the solder bump 15 decreases. As a result, there is a possibility that, for example, the solder bump 15 may be separated, resulting in disconnection, thus degrading mounting reliability.

In particular, in the case where electroless plating containing phosphorus (P) is used for forming the nickel (Ni) layer 2 on the copper layer 1, a phosphorus-rich layer is formed on the surface of the nickel (Ni) layer 2, and there is a possibility that the bonding strength between the nickel (Ni) layer 2 and the solder bump 15 may be decreased compared with the case where a known solder containing lead (Pb), such as a tin (Sn)-lead (Pb) solder, is used.

SUMMARY

The present invention has been achieved in view of the problems described above. It is an object of the present invention to provide a circuit board to which a solder ball composed of a lead (Pb)-free solder is to be connected, a semiconductor device including an electrode and a solder ball composed of a lead (Pb)-free solder disposed on the electrode, and a method of manufacturing the semiconductor device, in which mounting reliability can be improved by enhancing the bonding strength (adhesion strength) between the solder ball composed of a lead (Pb)-free solder and the electrode.

According to an aspect of the present invention, a circuit board is provided, the circuit board having an electrode to which a solder ball composed of a lead (Pb)-free solder is to be connected, wherein the electrode includes a first layer containing copper (Cu) as a main component, a second layer disposed on the first layer, the second layer containing nickel (Ni) as a main component, and a third layer disposed on the second layer, the third layer containing a tin-nickel (Sn-Ni) alloy as a main component.

According to another aspect of the present invention, a semiconductor device includes a first electrode disposed on a substrate and a solder ball composed of a lead (Pb)-free solder disposed on the first electrode, wherein the first electrode includes a first layer containing copper (Cu) as a main component, a second layer disposed on the first layer, the second layer containing nickel (Ni) as a main component, and a third layer disposed on the second layer, the third layer containing a tin-nickel (Sn-Ni) alloy as a main component.

According to another aspect of the present invention, a method of manufacturing a semiconductor device includes a step of forming a first electrode on a substrate and a step of forming a solder ball composed of a lead (Pb)-free solder on the first electrode. The step of forming the first electrode includes a sub-step of forming a first layer containing copper (Cu) as a main component, a sub-step of forming a second layer containing nickel (Ni) as a main component on the first layer, a sub-step of forming a third layer containing tin (Sn) as a main component on the second layer, and a sub-step of forming an alloy layer derived from the second layer and the third layer by performing a heating treatment after the sub-step of forming the third layer.

DESCRIPTION OF THE PREFERRED EMBODIMENTS

A first embodiment of the present invention will be described below with reference to FIGS. 5A to 10C.

A semiconductor device, a method of manufacturing the semiconductor device, and a method of connecting a support board of the semiconductor device to a wiring circuit board according to the embodiment of the present invention will be described using, as an example, a support board in which semiconductor elements are mounted on one principal surface and solder balls composed of a lead (Pb)-free solder not containing lead (Pb) are connected to the other principal surface. For the convenience of explanation, the method of manufacturing a semiconductor device will be described step by step, and the structure of the support board will also be described in the description of the manufacturing method.

Figures 5A, 5B:
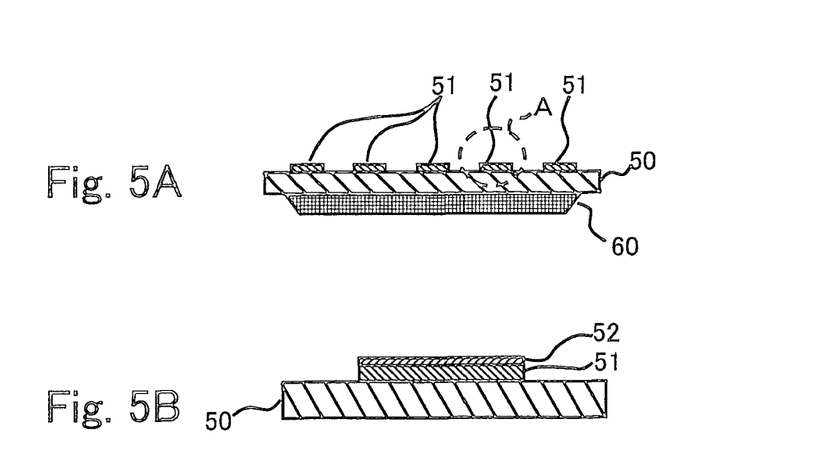
FIGS. 5A and 5B are cross-sectional views according to an embodiment of the present invention.

In the method of manufacturing a semiconductor device according to the embodiment of the present invention, as shown in FIG. 5A, first, a support board (package board) 50 is prepared. The support board 50 includes a base composed of an insulating resin, such as a glass epoxy resin, and a plurality of wiring substrates disposed on the base, each wiring substrate having a conductive layer composed of copper (Cu) or the like selectively arranged on the surface thereof.

Semiconductor elements (not shown) are mounted on one principal surface of the support board 50, and the semiconductor elements are resin-sealed with a sealing resin 60, such as a silicone resin, acrylic resin, or epoxy resin.

FIG. 5B is an enlarged view of a section surrounded by the dotted line A in FIG. 5A. A copper (Cu) layer 51 is formed by electroless plating on the other principal surface of the support board 50. However, the copper (Cu) layer 51 may be formed by photolithography or the like. In the case of photolithography, a resist is applied to the support board 50 provided with a conductive layer composed of copper (Cu) or the like, exposure and development are performed using a mask having a predetermined pattern, and then unnecessary portions of the conductive layer are removed by etching. Thereby, each copper layer 51 is obtained.

A nickel (Ni) layer 52 containing nickel (Ni) as a main component with a thickness of about 5 μm is formed by electroless plating on the copper (Cu) layer 51. Since the nickel (Ni) layer 52 is disposed on the copper (Cu) layer 51, the copper (Cu) in the copper (Cu) layer 51 can be prevented from being oxidized. Furthermore, electroless plating can reduce cost compared with electrolytic plating. In FIG. 5A, in order to facilitate viewing, the nickel (Ni) layers 52 are not shown.

Figure 6A:
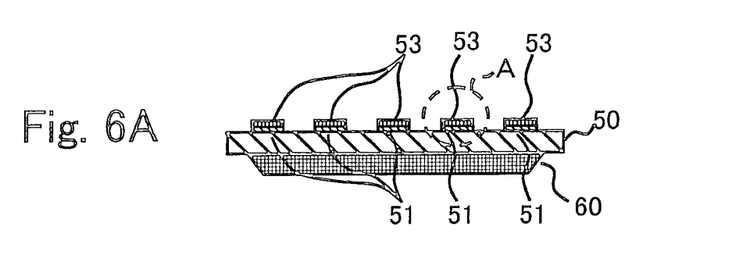
FIG. 6A to 6C are cross-sectional views showing steps subsequent to FIG. 5B in a method of connecting a support board of the semiconductor device.
Figure 6B:
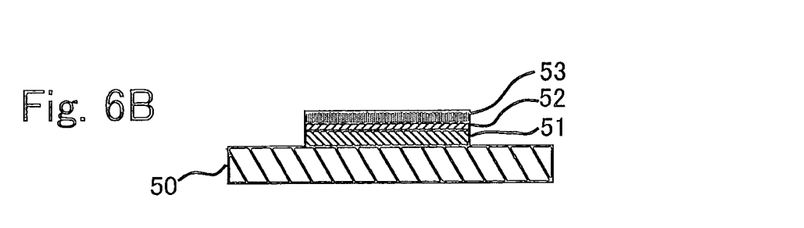

Next, as shown in FIG. 6A and FIG. 6B, which is an enlarged view of a section surrounded by the dotted line A in FIG. 6A, a tin (Sn) paste in which particles containing tin (Sn) as a main component are dispersed is applied to the upper surface of the nickel (Ni) layer 52 at a thickness of about 100 to 150 μm, thereby forming a tin (Sn) layer 53. That is, prior to the formation of solder bumps 65 in the step described later, the tin (Sn) layer 53 is formed on the upper surface of the nickel (Ni) layer 52. In FIG. 6A, in order to facilitate viewing, the nickel (Ni) layers 52 are not shown.

Specifically, a tin (Sn) paste is applied to the upper surface of the nickel (Ni) layer 52 by screen printing using a metal mask having the same pattern as that for the copper (Cu) layer 51 with a thickness of about 150 μm. Thereby, the tin (Sn) layer 53 is formed. However, the method for forming the tin (Sn) layer 53 is not limited to the method using the tin (Sn) paste, but electrolytic plating may be used.

Furthermore, a gold (Au) layer containing gold (Au) as a main component may be formed on the upper surface of the nickel (Ni) layer 52, and the tin (Sn) layer 53 may be formed on the upper surface of the gold (Au) layer. By forming the gold (Au) layer on the nickel (Ni) layer 52, the copper (Cu) constituting the copper (Cu) layer 51 can be prevented from being oxidized, and when the solder bump 65 is formed in the step described later, wettability of solder can be ensured. However, it is not always necessary to form the gold (Au) layer because, by forming the tin (Sn) layer 53 on the nickel (Ni) layer 52, the copper (Cu) can be prevented from being oxidized and wettability of solder can be ensured when the solder bump 65 is formed.

Figure 6C:
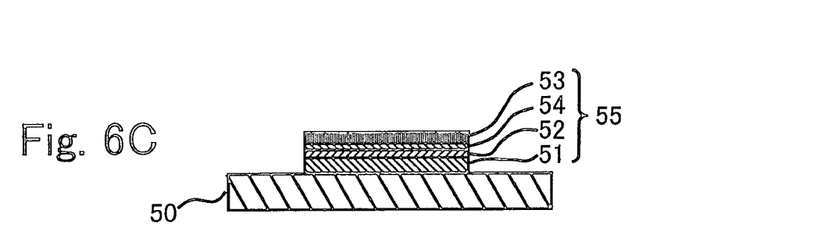

Then, a heat treatment is performed at a temperature of 232° C., which is the melting point of tin (Sn), or higher, for example, at about 250° C. in a nitrogen (N2) atmosphere. Thereby, as shown in FIG. 6C, a barrier layer 54 is formed at the interface between the nickel (Ni) layer 52 and the tin (Sn) layer 53, the barrier layer 54 being composed of a tin (Sn)-nickel (Ni) compound and having a thickness of about 1 to 2 μm.

Thereby, the support board 50 provided with an electrode portion 55, in which the copper (Cu) layer 51, the nickel (Ni) layer 52, the barrier layer 54 composed of a tin (Sn)-nickel (Ni) compound, and the tin (Sn) layer 53 are disposed in that order on the support board 50, is completed.

Because of the presence of the barrier layer 54 composed of the tin (Sn)-nickel (Ni) compound, the copper (Cu) in the solder bump 65 to be mounted in the subsequent step can be prevented from diffusing into the nickel (Ni) layer 52. Such a barrier layer 54 is formed before the solder bump 65 is provided.

The heat treatment is continued until the support board 50 and the wiring circuit board (motherboard) 70 which will be described later are bonded to each other through the solder bumps 65.

Figure 7A:
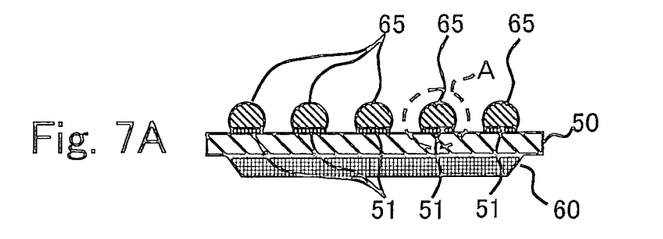
FIGS. 7A and 7B are cross-sectional views showing a step subsequent to the step shown in FIG. 6C in the method of connecting the support board of the semiconductor device to the wiring circuit board.
Figure 7B:
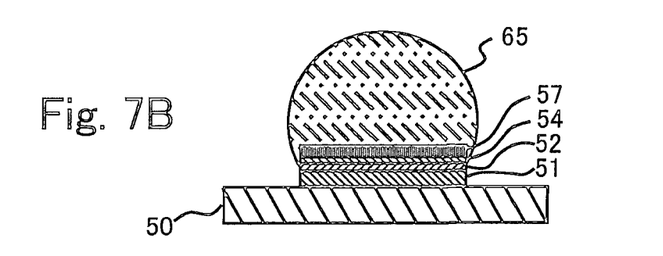

Next, as shown in FIG. 7A and FIG. 7B, which is an enlarged view of a section surrounded by the dotted line A in FIG. 7A, solder bumps 65, which are spherical, projecting electrodes for external connection, composed of a tin (Sn)-silver (Ag)-copper (Cu) solder as a lead (Pb)-free solder are disposed on the corresponding electrode portions 55. As the lead (Pb)-free solder constituting the solder bumps 65, for example, tin (Sn)-3.0 silver (Ag)-0.5 copper (Cu) (Sn:Ag:Cu=96.5:3.0:0.5, in terms of weight ratio) excellent in thermal fatigue resistance can be used.

As described above, the tin (Sn) layer 53 containing tin (Sn) as a main component is disposed as the uppermost layer of each electrode portion 55. Consequently, when the solder bump 65 is bonded onto the electrode portion 55, the solder bump 65 wets the surface of the tin (Sn) layer 53. As a result, a ternary compound layer 57 composed of tin (Sn)-nickel (Ni)-copper (Cu), which is brittler than the barrier layer 54, is formed at the junction interface between the barrier layer 54 composed of the tin (Sn)-nickel (Ni) compound and the solder bump 65.

However, unlike the known embodiments shown in FIGS. 3A to 4, the ternary compound layer 57 composed of tin (Sn)-nickel (Ni)-copper (Cu) is not directly disposed on the nickel layer 52, but the barrier layer 54, which is composed of the tin (Sn)-nickel (Ni) compound and tougher than the ternary compound layer 57, is placed between the nickel (Ni) layer 52 and the ternary compound layer 57. Consequently, it is possible to ensure the bonding strength between the solder bump 65 and the nickel (Ni) layer 52 to be sufficient and equivalent to the bonding strength in the known embodiment shown in FIGS. 1A to 2 in which the solder bump 5 containing lead (Pb) is used.

Furthermore, since the barrier layer 54 composed of the tin (Sn)-nickel (Ni) compound is disposed on the nickel layer 52, the copper (Cu) contained in the solder bump 65 can be prevented from diffusing into the nickel (Ni) layer when the solder bump 65 is provided on the electrode portion 55 (refer to FIG. 6C). Consequently, it is possible to prevent the nickel (Ni) layer 52 and the barrier layer 54 from being separated at the interface therebetween.

Furthermore, since the barrier layer 54 composed of the tin (Sn)-nickel (Ni) compound is disposed on the nickel (Ni) layer 52, the nickel (Ni) contained in the nickel (Ni) layer 52 can also be prevented from diffusing into the solder bump 65. Consequently, even when electroless plating containing phosphorus (P) is used for forming the nickel (Ni) layer 52 on the copper (Cu) layer 51, phosphorus (P) can be prevented from diffusing into the solder bump 65. Thus, it is possible to prevent an increase in the content of phosphorus (P), which may decrease the bonding strength between the nickel (Ni) layer 52 and the solder bump 65, in the solder bump 65.

In such a manner, a semiconductor device 40 in which the solder bumps 65 are bonded to the support board 50 is obtained.

In this example, as the lead (Pb)-free solder constituting the solder bumps 65, tin (Sn)-3.0 silver (Ag)-0.5 copper (Cu) (Sn:Ag:Cu=96.5:3.0:0.5, in terms of weight ratio) excellent in thermal fatigue resistance is used. However, the present invention is not limited to such an example. In view of environmental protection, as long as lead (Pb) is not contained, as a metal that is combined with tin (Sn) and constitutes the solder used in the present invention, copper (Cu), silver (Ag), or copper (Cu) may be used, or copper (Cu) and nickel (Ni) or the like may be used. Furthermore, the number of metals to be combined with tin (Sn) is not particularly limited. Examples of the lead (Pb)-free solder that can constitute the solder bumps 65 include tin (Sn)-silver (Ag)-copper (Cu)-based solders, such as tin (Sn)-3.8 silver (Ag)-1.0 copper (Cu), tin (Sn)-1.0 silver (Ag)-0.7 copper (Cu), and tin (Sn)-0.3 silver (Ag)-0.7 copper (Cu); tin (Sn)-copper (Cu)-based solders, such as tin (Sn)-0.75 copper (Cu); and tin (Sn)-copper (Cu)-nickel (Ni)-based solders, such as tin (Sn)-0.7 copper (Cu)-0.03 nickel (Ni)+phosphorus (P) and tin (Sn)-0.7 copper (Cu)-0.05 nickel (Ni)+germanium (Ge).

In FIG. 7A, in order to facilitate viewing, the nickel (Ni) layers 52, the barrier layers 54, and the ternary compound layers 57 are not shown.

Figure 8:
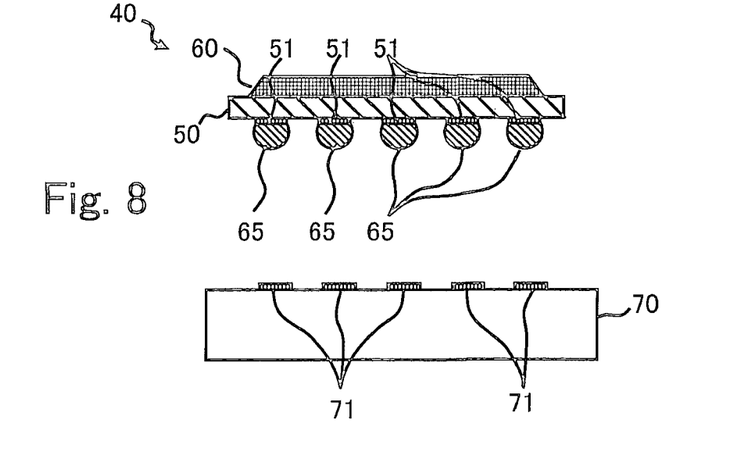
FIG. 8 is a cross-sectional view showing a semiconductor and a circuit board, which are located to be connected each other, according to an embodiment of the present invention.

Next, as shown in FIG. 8, the solder bumps 65 bonded to the support board 50 and electrodes 71 composed of copper (Cu) disposed on a principal surface of the wiring circuit board (motherboard) 70 are aligned with each other. The wiring circuit board (motherboard) 70 includes a base composed of an insulating resin, such as glass epoxy resin, and a conductive layer composed of copper (Cu) or the like selectively arranged on the surface of the base. In FIG. 8, in order to facilitate viewing, the nickel (Ni) layers 52, the barrier layers 54, and the ternary compound layers 57 are not shown.

Figure 9A:
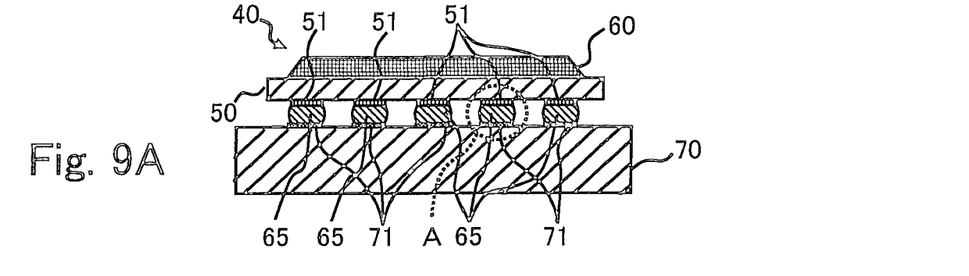
FIG. 9A is a cross-sectional view of a semiconductor and a circuit board according to an embodiment of the present invention, each of which are connected each other.
Figure 9B:
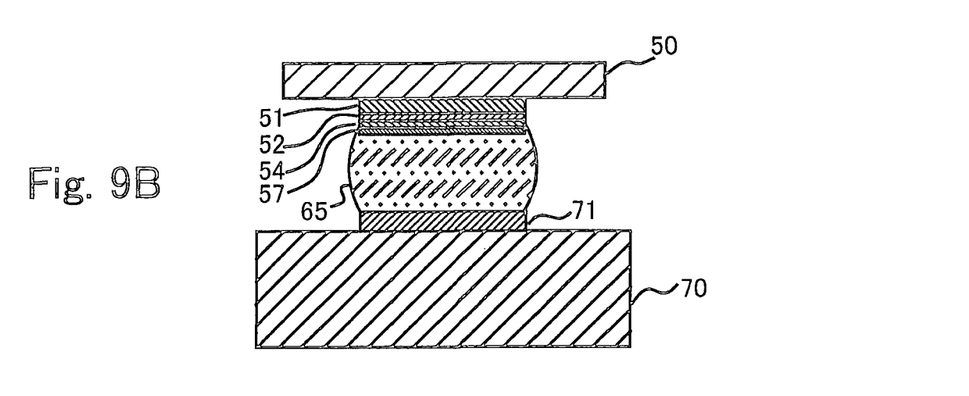
FIG. 9B is a enlarged cross-sectional view of a portion indicated by a circle A in FIG. 9A.

Next, as shown in FIGS. 9A and 9B, the solder bumps 65 bonded to the support board 50 are bonded to the electrodes 71 of the wiring circuit board 70. Thereby, a structure in which the support board 50 of the semiconductor device 40 is bonded to the wiring circuit board 70 through the solder bumps 65 is formed.

In FIG. 9A, in order to facilitate viewing, the nickel (Ni) layers 52, the barrier layers 54, and the ternary compound layers 57 are not shown. FIG. 9B is an enlarged view of a section surrounded by the dotted line A in FIG. 9A.

The inventor of the present invention carried out a tensile test with respect to a structure in which a nickel (Ni) layer 52, a barrier layer 54, and a ternary compound layer 57 are disposed on a copper (Cu) layer 51 disposed on a support board 50, and a solder bump 65 is provided on the ternary compound layer 57. The changes in the tensile strength (bonding strength) with time are shown in a graph of FIG. 10A.

Furthermore, the inventor of the present invention carried out a tensile test with respect to a structure, as a comparative example, in which a nickel (Ni) layer 12 and a ternary compound layer 7 are disposed on a copper (Cu) layer 11 disposed on a support board 10, and a solder bump 15 is provided on the ternary compound layer 7. The changes in the tensile strength (bonding strength) with time are shown in a graph of FIG. 10B.

Figure 10A:
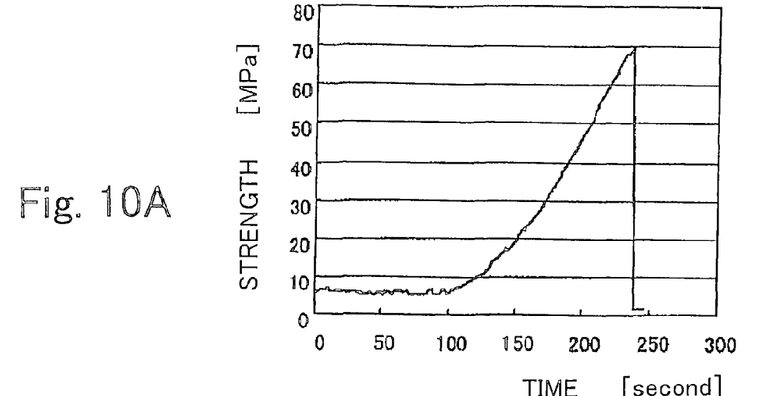
FIGS. 10A to 10C are graphs showing the results of tensile tests.
Figure 10B:
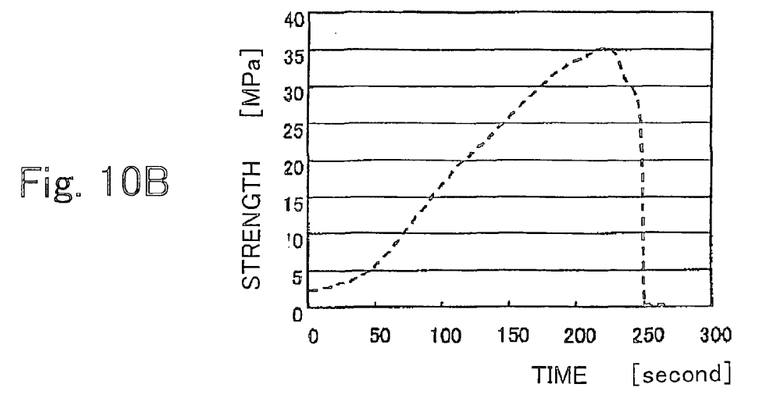
Figure 10C:
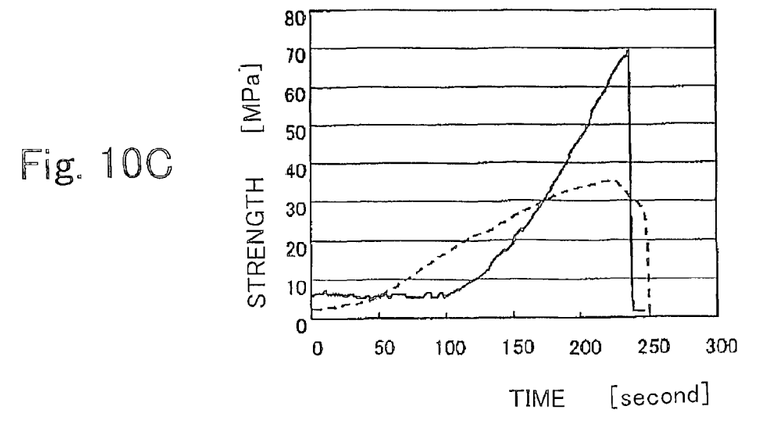

In FIG. 10C, a graph showing both the results of the tensile test shown in FIG. 10A and the results of the tensile test shown in FIG. 10B is shown in order to facilitate comparison.

As is evident from FIGS. 10A and 10C, in the structure in which the nickel (Ni) layer 52, the barrier layer 54, and the ternary compound layer 57 are disposed on the copper (Cu) layer 51 disposed on the support board 50, and the solder bump 65 is provided on the ternary compound layer 57, a bonding strength of about 70 MPa is obtained. In contrast, as is evident from FIGS. 10B and 10C, in the structure in which the nickel (Ni) layer 12 and the ternary compound layer 7 are disposed on the copper (Cu) layer 11 disposed on the support board 10, and the solder bump 15 is provided on the ternary compound layer 7, the bonding strength is about 35 MPa.

That is, it has been confirmed that in the structure in which the nickel (Ni) layer 52, the barrier layer 54, and the ternary compound layer 57 are disposed on the copper (Cu) layer 51 disposed on the support board 50, and the solder bump 65 is provided on the ternary compound layer 57, higher bonding strength can be obtained than that in the structure in which the nickel (Ni) layer 12 and the ternary compound layer 7 are disposed on the copper (Cu) layer 11 disposed on the support board 10, and the solder bump 15 is provided on the ternary compound layer 7.

As described above, according to the first embodiment of the present invention, by applying a tin (Sn) paste onto the nickel (Ni) layer 52 and performing a heat treatment thereon, it is possible to easily form the barrier layer 54 which is composed of a tin (Sn)-nickel (Ni) compound and tougher than the ternary compound layer 57.

Since the barrier layer 54 is placed between the nickel (Ni) layer 52 and the ternary compound layer 57, it is possible to ensure the bonding strength between the solder bump 65 and the nickel (Ni) layer 52 to be sufficient and equivalent to the bonding strength in the known embodiment shown in FIG. 1A to 2 in which the solder bump 5 containing lead (Pb) is used. Consequently, it is possible to prevent the solder bump 65 from being separated, resulting in disconnection, or the like, and mounting reliability can be improved. Furthermore, since the barrier layer 54 is disposed on the nickel (Ni) layer 52, the copper (Cu) contained in the solder bump 65 can be prevented from diffusing into the nickel (Ni) layer 52 when the solder bump 65 is disposed on the electrode portion 55 (refer to FIG. 6C). Consequently, it is possible to prevent the nickel (Ni) layer 52 and the barrier layer 54 from being separated at the interface therebetween.

Furthermore, it is also possible to prevent the nickel (Ni) contained in the nickel (Ni) layer 52 from diffusing into the solder bump 65. Consequently, even when electroless plating containing phosphorus (P) is used for forming the nickel (Ni) layer 52 on the copper (Cu) layer 51, phosphorus (P) can be prevented from diffusing into the solder bump 65. Thus, it is possible to prevent an increase in the content of phosphorus (P), which may decrease the bonding strength between the nickel (Ni) layer 52 and the solder bump 65, in the solder bump 65.

While the embodiment of the present invention has been described above in detail, it is to be understood that the present invention is not limited to the particular embodiment. The scope of the following claims is to be accorded the broadest interpretation so as to encompass all modifications and equivalent structures and functions.

For example, in the embodiment described above, as an example of the circuit board to which solder balls composed of a lead (Pb)-free solder are connected, a support board (package board) on one principal surface of which semiconductor elements are mounted is used. However, the present invention is not limited to such a case. For example, the present invention is also applicable to a chip-on-chip (COC)-type semiconductor device package in which wiring circuit boards (motherboards) or a plurality of semiconductor elements are three-dimensionally mounted and packaged.

An embodiment in which the present invention is applied to a wiring circuit board (motherboard) in addition to a support board on which semiconductor elements are mounted will now be described with reference to FIGS. 11A to 12B. FIGS. 11A to 12B are each an enlarged view of a connecting portion between a wiring circuit board and the support board 50 which has been described with reference to FIGS. 5A to 9B.

Figure 11A:
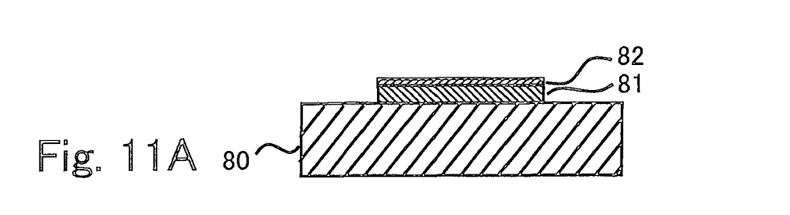
FIGS. 11A to 11C are cross-sectional views showing an example in which the present invention is applied to a wiring circuit board.

In order to manufacture a wiring circuit board (motherboard) 80 to which the present invention is applied, as shown in FIG. 11A, first, the first the wiring circuit board (motherboard) 80 is prepared. The wiring circuit board 80 includes a base composed of an insulating resin, such as a glass epoxy resin, and a plurality of wiring substrates disposed on the base, each wiring substrate having a conductive layer composed of copper (Cu) or the like selectively arranged on the surface thereof.

A copper (Cu) layer 81 containing copper (Cu) as a main component is formed by electroless plating on a principal surface of the wiring circuit board 80. However, the copper (Cu) layer 81 may be formed by photolithography or the like.

A nickel (Ni) layer 82 containing nickel (Ni) as a main component with a thickness of about 5 μm is formed by electroless plating on the copper (Cu) layer 81. Since the nickel (Ni) layer 82 is disposed on the copper (Cu) layer 81, the copper (Cu) in the copper (Cu) layer 81 can be prevented from being oxidized. Furthermore, electroless plating can reduce cost compared with electrolytic plating.

Figure 11B:
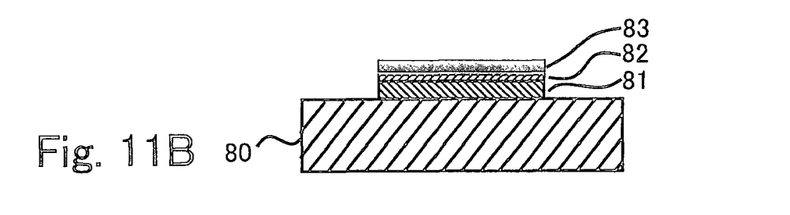

Next, as shown in FIG. 11B, a tin (Sn) paste in which particles containing tin (Sn) as a main component are dispersed is applied to the upper surface of the nickel (Ni) layer 82 at a thickness of about 150 μm, thereby forming a tin (Sn) layer 83. That is, prior to the formation of solder bump 65 in the step described later, the tin (Sn) layer 83 is formed on the upper surface of the nickel (Ni) layer 82. The method for forming the tin (Sn) layer 83 is not limited to the method using the tin (Sn) paste, but electrolytic plating may be used.

Furthermore, a gold (Au) layer containing gold (Au) as a main component may be formed on the upper surface of the nickel (Ni) layer 82, and the tin (Sn) layer 83 may be formed on the upper surface of the gold (Au) layer. By forming the gold (Au) layer on the nickel (Ni) layer 82, the nickel (Ni) constituting the nickel (Ni) layer 82 can be prevented from being oxidized, and when the solder bump 65 is formed in the step described later, wettability of solder can be ensured. However, it is not always necessary to form the gold (Au) layer because, by forming the tin (Sn) layer 83 on the nickel (Ni) layer 82, the copper (Cu) can be prevented from being oxidized and wettability of solder can be ensured when the solder bump 65 is formed.

Figure 11C:
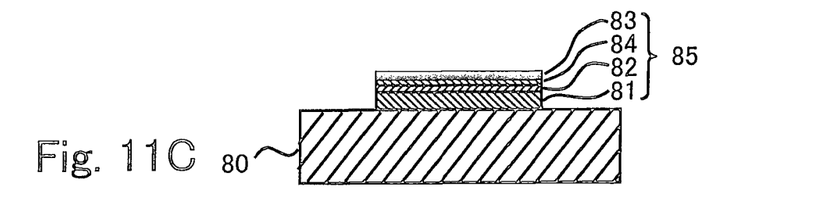

Then, a heat treatment is performed at a temperature of 232° C., which is the melting point of tin (Sn), or higher, for example, at about 250° C. in a nitrogen (N2) atmosphere. Thereby, as shown in FIG. 11C, a barrier layer 84 is formed at the interface between the nickel (Ni) layer 82 and the tin (Sn) layer 83, the barrier layer 84 being composed of a tin (Sn)-nickel (Ni) compound and having a thickness of about 1 to 2 μm.

Thereby, the wiring circuit board 80 provided with an electrode portion 85, in which the copper (Cu) layer 81, the nickel (Ni) layer 82, the barrier layer 84 composed of a tin (Sn)-nickel (Ni) compound, and the tin (Sn) layer 83 are disposed in that order on the wiring circuit board 80, is completed.

The barrier layer 84 composed of a tin (Sn)-nickel (Ni) compound prevents the copper (Cu) in the solder bump 65 to be mounted in the subsequent step from diffusing into the nickel (Ni) layer 82. Such a barrier layer 84 is formed before the solder bump 65 is provided.

Figure 12A:
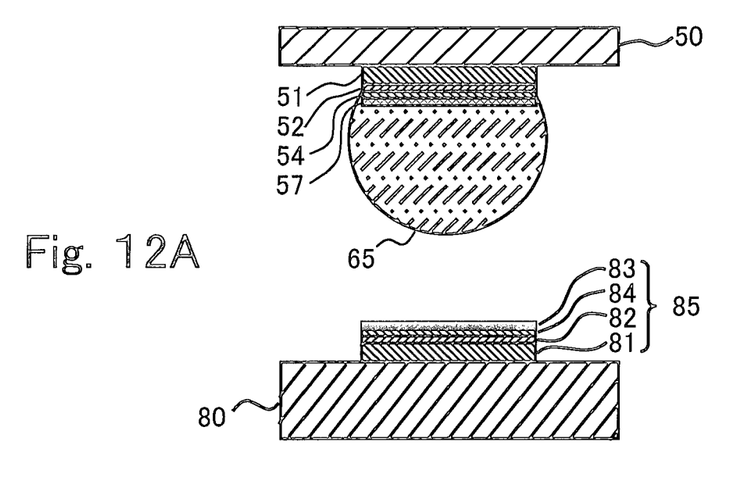
FIGS. 12A and 12B are cross-sectional views showing a step subsequent to the step shown in FIG. 11C.
Figure 12B:
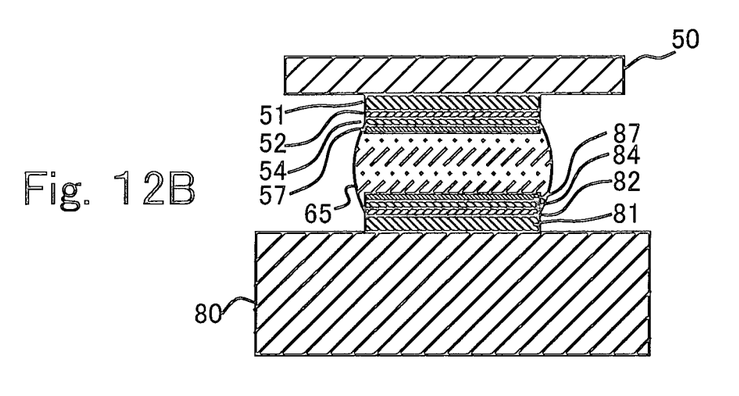

While maintaining the heat treatment condition at a temperature of 232° C., which is the melting point of tin (Sn), or higher, for example, at about 250° C. in a nitrogen (N2) atmosphere, as shown in FIG. 12A, the solder bump 65 bonded to the support board 50 is aligned with the electrode portion 85 including copper (Cu) disposed on the principal surface of the wiring circuit board (motherboard) 80. Then, as shown in FIG. 12B, the solder bump 65 bonded to the support board 50 is bonded to the electrode portion 85 of the wiring circuit board 80. Thereby, a structure is obtained in which the support board 50 of the semiconductor device 40 and the wiring circuit board 80 are bonded to each other through the solder bumps 65.

As described above, the tin (Sn) layer 83 (FIG. 11C) containing tin (Sn) as a main component is disposed as the uppermost layer of the electrode portion 85. Consequently, when the solder bump 65 is bonded onto the electrode portion 85, the solder bump 65 wets the surface of the tin (Sn) layer 83. As a result, a ternary compound layer 87 composed of tin (Sn)-nickel (Ni)-copper (Cu), which is brittler than the barrier layer 84, is formed at the junction interface between the barrier layer 84 composed of the tin (Sn)-nickel (Ni) compound disposed on the nickel layer 82 and the solder bump 65.

However, the ternary compound layer 87 composed of tin (Sn)-nickel (Ni)-copper (Cu) is not directly disposed on the nickel layer 82, but the barrier layer 84, which is composed of the tin (Sn)-nickel (Ni) compound and tougher than the ternary compound layer 87, is placed between the nickel (Ni) layer 82 and the ternary compound layer 87. Consequently, it is possible to ensure the bonding strength between the solder bump 65 and the nickel (Ni) layer 82 to be sufficient and equivalent to the bonding strength in the known embodiment shown in FIGS. 1A to 2 in which the solder bump 5 containing lead (Pb) is used.

Furthermore, since the barrier layer 84 composed of the tin (Sn)-nickel (Ni) compound is disposed on the nickel layer 82, the copper (Cu) contained in the solder bump 65 can be prevented from diffusing into the nickel (Ni) layer when the solder bump 65 is provided on the electrode portion 85 (refer to FIG. 11C). Consequently, it is possible to prevent the nickel (Ni) layer 82 and the barrier layer 84 from being separated at the interface therebetween.

Furthermore, since the barrier layer 84 composed of the tin (Sn)-nickel (Ni) compound is disposed on the nickel (Ni) layer 82, the nickel (Ni) contained in the nickel (Ni) layer 82 can also be prevented from diffusing into the solder bump 65. Consequently, even when electroless plating containing phosphorus (P) is used for forming the nickel (Ni) layer 82 on the copper (Cu) layer 81, phosphorus (P) can be prevented from diffusing into the solder bump 65. Thus, it is possible to prevent an increase in the content of phosphorus (P), which may decrease the bonding strength between the nickel (Ni) layer 82 and the solder bump 65, in the solder bump 65.

As described above, according to this embodiment, it is possible to enhance the bonding strength (adhesion strength) between the solder ball 65 composed of a lead-free solder and each of the nickel (Ni) layer 52 of the support board 50 and the nickel (Ni) layer 82 of the wiring circuit board 80. Consequently, mounting reliability can be improved.

What is claimed is:

1. A method for manufacturing a semiconductor device, the method comprising steps of:
    forming a first electrode on a first base; and forming a solder ball composed of lead free solder on the first electrode, wherein the step of forming the first electrode comprises steps of: forming a first layer containing copper as a main component on the first base; forming a second layer containing nickel as a main component on the first layer; forming a third layer containing tin as a main component on the second layer; and forming an alloy layer of the second layer and the third layer by a heat treatment after the step of forming the third layer; wherein an alloy of tin, nickel, and copper is formed between the solder ball and the first electrode by the step of the solder ball; and
    the further comprising a step of connecting the solder ball to a circuit board; wherein the circuit board comprising: a second base; and a second electrode formed on the second base, wherein the second electrode comprising: a fifth layer containing copper as a main component and formed on the second base; a sixth layer containing nickel as a main component and formed on the fifth layer; and a seventh layer containing an alloy of tin and nickel as a main component and formed on the sixth layer.

2. The method for manufacturing a semiconductor device according to 1, wherein the heat treatment is performed at a temperature, the temperature being equal to or higher than a melting point of the tin.

3. The method for manufacturing a semiconductor device according to 1, wherein the steps of forming the first layer and forming the second layer are performed by an electroless plating.

4. The method for manufacturing a semiconductor device according to 1, wherein the solder ball contains tin and copper.

5. The method for manufacturing a semiconductor device according to 4, wherein the solder ball further contains silver.

6. The method for manufacturing a semiconductor device according to 1, further comprising a step of forming a fourth layer containing gold as a main component between the steps of forming the second layer and forming the third layer.

* * * * *